United States Patent [19]

Sato et al.

[11] Patent Number: 4,935,067
[45] Date of Patent: Jun. 19, 1990

[54] SOLAR CELL AND FABRICATION METHOD THEREOF

[75] Inventors: Katsumi Sato; Shigeru Hokuyo; Hideo Matsumoto, all of Itami, Japan

[73] Assignee: Mitsubishi Denki Kabushiki Kaisha, Tokyo, Japan

[21] Appl. No.: 304,029

[22] Filed: Jan. 31, 1989

[30] Foreign Application Priority Data

Feb. 10, 1988 [JP] Japan .................... 63-29206

[51] Int. Cl.$^5$ .................... H01L 31/06; H01L 31/18
[52] U.S. Cl. .................... 136/255; 136/262; 437/2; 437/5
[58] Field of Search .................... 136/255, 262, 244; 437/2, 5

[56] References Cited

U.S. PATENT DOCUMENTS 4,846,896  7/1989  Hokuyo .................... 136/255

FOREIGN PATENT DOCUMENTS 1320775  2/1963  France .................... 136/255
2206732A 1/1989  United Kingdom .................... 136/255

OTHER PUBLICATIONS

Solar Cell Array Design Handbook, vol. 1, Oct. 1976, National Aeronautics and Space Administration.
Photovoltaic Generators in Space, Proceedings of the Fifth European Symposium, co-sponsored by the European Space Agency (ESA) the Netherlands Agency for Aerospace Programs (NIVR) and Fokker B.V. and held at the Hague/Scheveningen, Netherlands on 30 Sep.-2 Oct. 1986.

Primary Examiner—Aaron Weisstuch
Attorney, Agent, or Firm—Oblon, Spivak, McClelland, Maier & Neustadt

[57] ABSTRACT

In the fabrication processes of a solar cell, a first p-n junction having a function required for supplying electric power to the exterior of the solar cell is formed in the vicinity of the light receiving surface, while a second p-n junction is provided in a position not reached by incident light. The two p-n junctions are interconnected in anti-parallel, so that, when a reverse voltage is applied to the first p-n junction, the second p-n junction is forward biased to have a current flow therein, thereby to prevent the solar cell from breaking down. Since the first and second p-n junctions are integrated with each other, the cost for fabricating the solar cell is decreased and the reliability thereof is increased.

17 Claims, 2 Drawing Sheets

SOLAR CELL AND FABRICATION METHOD THEREOF

BACKGROUND OF THE INVENTION

1. Field of the Invention

The present invention relates to a solar cell employed in a photovoltaic generator in which a plurality of the solar cells are interconnected in series, and a fabrication method thereof. More particularly, the present invention relates to a technique for preventing the solar cells from breaking down by a reverse voltage applied thereto when a part of the solar cells interconnected in series is shaded.

2. Description of the Prior Art

The fundamental structure of a conventional solar cell is a diode having a p-n junction. Accordingly, when it is employed in a practical power generator, a plurality of the solar cells should be interconnected in series so that the total voltage obtained by adding the voltages generated in respective solar cells reaches a desired voltage level.

When a part of the solar cells interconnected in series is shaded during power generating operation, only the shaded solar cell loses its power generating function. In this case, voltage generated by the other solar cells interconnected in series is applied to the shaded solar cell as a reverse voltage of the diode thereof. As a result, when the reverse breakdown voltage of the solar cell is low, the shaded solar cell is broken down, so that the function thereof required for photovoltaic power generation is lowered or lost. In order to prevent the shaded solar cell from breaking down, the reverse breakdown voltage of the solar cell should be increased, or alternately, another diode should be provided in anti-parallel to each group of solar cells whose generating voltage in total is lower than the reverse breakdown voltage of the individual solar cell.

Increase of the reverse breakdown voltage of the solar cell may be achieved by decreasing the impurity concentration in the base layer thereof. In general, a solar cell should have a p-n junction provided in a shallow region from the light receiving surface of the same, and especially in a solar cell used in cosmic space, the p-n junction must be provided in a shallow region separated from the light receiving surface by a distance of 0.3 $\mu$m to 0.5 $\mu$m or less. Although it is possible in a laboratory to form such a p-n junction by a diffusion process with respect to the base layer having low impurity concentration required for a reverse breakdown voltage of several hundred volts, this process is hardly applicable to mass production of solar cells. Especially in a GaAs solar cell, it is difficult to obtain low impurity concentration in the crystal growth process, and therefore, a reverse breakdown voltage over several ten volts cannot be obtained. Thus, increase of the reverse breakdown voltage of a solar cell is difficult by use of conventional techniques, and consequently, conventional solar cells are rarely employed in a high voltage generation system.

On the other hand, the insertion of the aforementioned additional diode is effective for the protection of the solar cell. However, this insertion brings an increase of the number of components, so that the fabrication cost of the solar cell is increased and the reliability on the system is lowered. Especially, the low reliability is a serious problem in cosmic space or like use of solar cells in which extremely high reliability is required.

SUMMARY OF THE INVENTION

The present invention is directed to a solar cell having means for protection against reverse voltage breakdown and a fabrication method of such solar cell.

According to the first aspect of the present invention, a solar cell comprises: a first conductivity type first semiconductor layer having first and second major surfaces; a second conductivity type second semiconductor layer extending from the first major surface to the second major surface of the first semiconductor layer through the first semiconductor layer, to divide the first semiconductor layer into a first semiconductor region having relatively large size and a second semiconductor region having relatively small size; and a second conductivity type third semiconductor layer formed on the first semiconductor region, the third semiconductor layer being separated from the second semiconductor layer and the second semiconductor region.

According to the second aspect of the present invention, a fabrication method of a solar cell comprises the steps of preparing a first conductivity type first semiconductor layer having first and second major surfaces; selectively diffusing impurities into the first semiconductor layer to form a second semiconductor layer extending from the first major surface of the first semiconductor layer to the second major surface of the first semiconductor layer through the first semiconductor layer, the second semiconductor layer dividing the first semiconductor layer into a first semiconductor region having relatively large size and a second semiconductor region having relatively small size; and forming a second conductivity type third semiconductor layer on the first semiconductor region, the third semiconductor layer being separated from the second semiconductor layer and the second semiconductor region.

Accordingly, it is an object of the present invention to provide a solar cell in which an additional diode structure is formed to be connected with the cell structure in anti-parallel, so that the solar cell is prevented from breaking down due to a reverse voltage applied thereto, while its fabrication cost is decreased and its reliability is improved.

Another object of the present invention is to provide a fabrication method for fabricating such a solar cell through practical processes.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 2A:
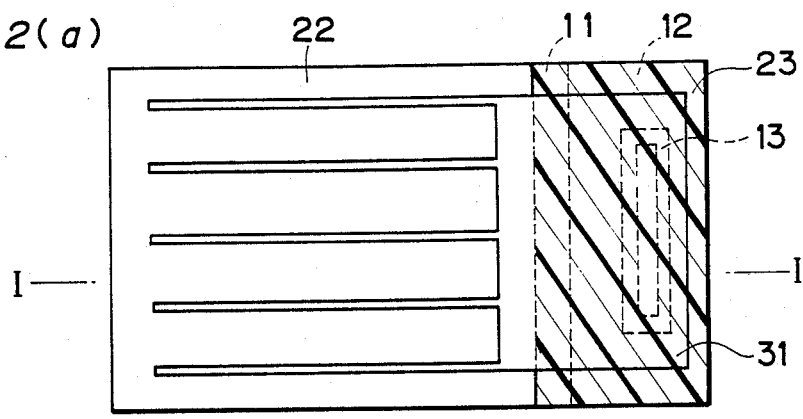
FIG. 2(a) and FIG. 2(b) are a plan view and a bottom view of the solar cell shown in FIG. 1, respectively.
Figure 2B:
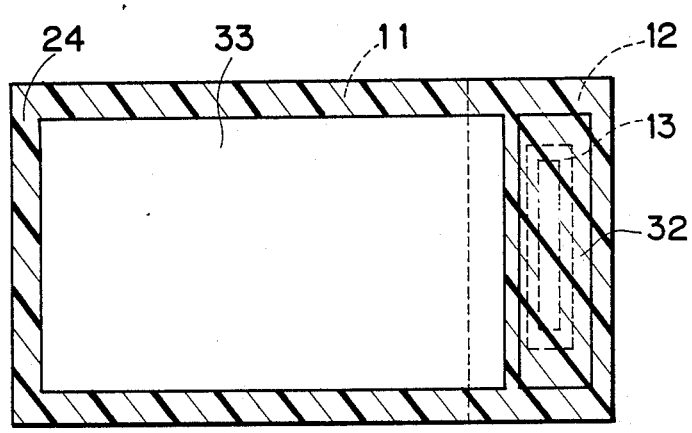
Figure 3:
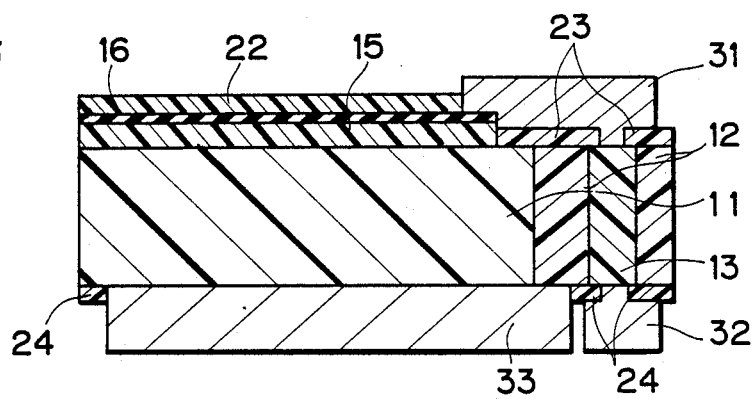
FIG. 3 is a cross sectional view taken along line I—I of FIG. 2(a).

FIG. 1(a) through FIG. 1(f) are cross sections of a semiconductor wafer showing the sequence of the process steps for the fabrication of a GaAs solar cell according to a preferred embodiment of the present invention. FIG. 2(a) and FIG. 2(b) are a plan view and a bottom view of the solar cell fabricated through the process steps shown in FIG. 1, respectively. FIG. 3 corresponds to a cross section of the solar cell taken along line I—I of FIG. 2(a). The same or corresponding components in FIG. 1 to FIG. 3 are labeled with the same reference numerals, respectively. Referring to FIG. 1 to FIG. 3, the process steps for the fabrication of the solar cell will be described below.

Figure 1A:
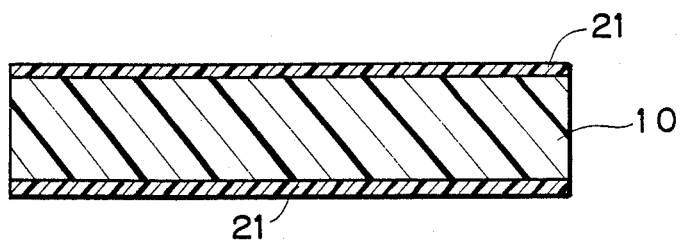
FIG. 1(a) to FIG. 1(f) are cross sectional views showing an embodiment of the fabrication method of a solar cell according to the present invention.

First, as shown in FIG. 1(a), a silicon nitride (Si₃N₄) film 21 serving as a mask for selective diffusion is formed on the both surfaces of an n-type GaAs substrate 10 by a CVD method.

Figure 1B:
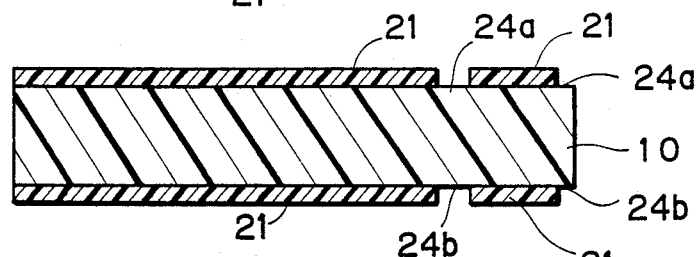

As shown in FIG. 1(b), a predetermined portion of the silicon nitride film 21 is removed by a photolithography technique to form windows 24a and 24b of square loop shape on the both surfaces of the n-type GaAs substrate 10.

Figure 1C:
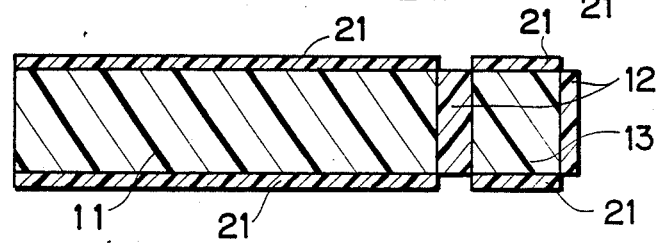

Zn atoms are diffused from both surfaces of the n-type GaAs substrate 10 through the windows 24a and 24b, to form a p-type GaAs layer 12 surrounding an n-type GaAs region 13, as shown in FIG. 1(c). The p-type GaAs layer 12 extends through the n-type GaAs substrate 10, thereby dividing the n-type GaAs substrate 10 into an n-type GaAs region 11 and the n-type GaAs region 13.

Figure 1D:
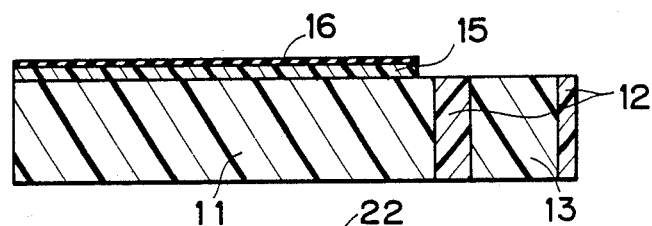

After removal of the silicon nitride film 21, a p-type GaAs layer 15 of about 0.5 μm in thickness is provided on the entire surface of a light receiving surface side by a crystal growth technique such as an LPE technique and an MOCVD technique, to form a p-n junction having a solar cell function. A p-type AlGaAs layer 16 of about 0.05 μm to 0.1 μm in thickness is then formed on the p-type GaAs layer 15. The p-type GaAs layer 15 and the p-type AlGaAs layer 16 are selectively removed by a photolithography technique, as shown in FIG. 1(d), to insulate the p-type GaAs layer 15 and the p-type AlGaAs layer 16 from the p-type GaAs layers 12 and the n-type GaAs region 13.

Figure 1E:
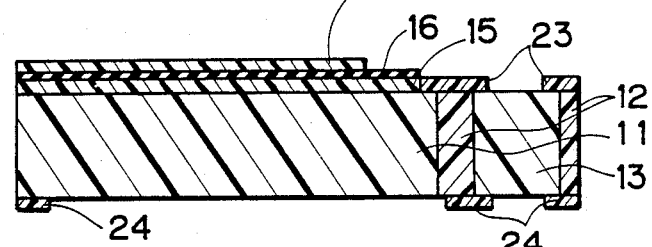

Next, a silicon nitride film (Si₃N₄) serving as an anti-reflection film and an insulation film is formed on the top surface of the semiconductor wafer, and another silicon nitride film serving as an insulation film is formed on the back surface thereof. Predetermined portions of the silicon nitride films of both surfaces are then removed by a photolighography technique, to form an anti-reflection film 22 and an insulation film 23 on the top surface of the semiconductor wafer and an insulation film 24 on the back surface, as shown in FIG. 1(e). The insulation films 23 and 24 are shown by slanted lines in FIG. 2(a) and FIG. 2(b). Referring to FIG. 2(a), an anti-reflection film 22 of comb type shape is formed on the p-type AlGaAs layer 16. The insulation film 23 covers the p-type GaAs layer 12. Referring to FIG. 2(b), the insulation film 24 covers the peripheral portion of the back surface of the semiconductor slice and the interface of the p-type GaAs layer 12 and the n-type GaAs region 13.

Figure 1F:
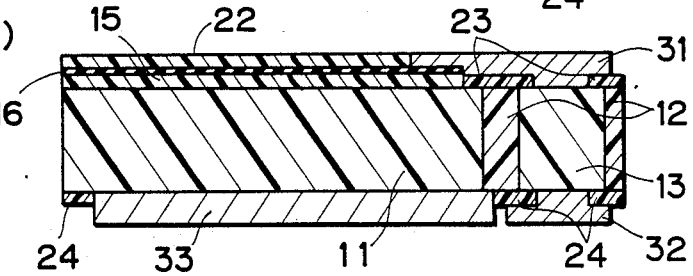

As shown in FIG. 1(f), an anode electrode 31 consisting of a grid electrode and an external connection electrode is then provided on the top surface, and an anode electrode 32 and a cathode electrode 33 serving as first and second external connection electrodes, respectively, are formed on the back surface.

In other words, the anode electrode 31 is formed on a portion of the surface of the p-type AlGaAs layer 16 not provided thereon with the anti-reflection film 22, the surface of the insulation film 23 and the surface of the n-type GaAs region 13 surrounded by the insulation film 23. The anode electrode 32 is formed on the surface of the insulation film 24 and the surface of the n-type GaAs region 13 surrounded by the insulation film 24. The cathode electrode 33 is formed on a portion of the back surface of the n-type GaAs region 11 not provided thereon with the insulation film 24 and a portion of the back surface of the p-type GaAs layer 12. Thus, the anode electrodes 31 and 32 are insulated from the p-type GaAs layer 12.

In the solar cell thus fabricated, a solar cell portion is made up of the p-type GaAs layer 15 and the n-type GaAs region 11, and a diode portion connected to the solar cell portion in anti-parallel is made up of the p-type GaAs region 12 and the n-type GaAs region 13.

When light is received on the top surface of the solar cell having the above described structure, photovoltaic power is generated between the p-type GaAs layer 15 and the n-type GaAs region 11, so that this structure functions as a solar cell in which positive and negative potentials appear in the anode electrodes 31 or 32 and the cathode electrode 33, respectively.

During the power generating operation, photovoltaic power generated between the p-type GaAs layer 12 and the n-type GaAs region 11 does not contribute to the photovoltaic power generation for supplying electric power to the exterior of the solar cell, since the p-type GaAs layer 12 and the n-type GaAs region 11 are electrically short-circuited.

On the other hand, the p-n junction consisting of the n-type GaAs region 13 and the p-type GaAs region 12 generates photovoltaic power in a direction opposite to the power generating direction of the solar cell. However, the p-n junction between the regions 13 and 12 does not substantially deteriorate the solar cell function by reversely generating power, because of the following reasons:

(a) light incident upon this p-n junction from the top and back surfaces is intercepted by metal electrode layers (i.e., the anode electrodes 31 and 32) covering this p-n junction at the top and back surfaces; and (b) light incident from the side surface (edge portion) hardly reaches this p-n junction because it is formed at a distance of over 20 μm from the edge portion.

In a solar cell module constructed by interconnecting the solar cells in series through the alternate external connections of the respective anode electrodes 31 and 32 and cathode electrodes 33, when a part of the solar cells is shaded, a reverse voltage is applied to the shaded solar cell, so that the anode electrodes 31 and 32 and the cathode electrode 33 thereof are biased in negative and positive potentials, respectively. Since the anti-parallel diode portion consisting of the p-type GaAs region 12 and the n-type GaAs region 13 is forward biased in the shaded solar cell, current flows from the cathode electrode 33 to the anode electrodes 31 and 32 through the shaded solar cell to suppress the voltage between electrodes 31 and 32 and 33. As a result, the reverse voltage is not substantially applied to the solar cell portion having a power generation function essential to the solar cell.

In general, the n-type GaAs substrate 10 and therefore the n-type GaAs region 11 are inferior in crystal quality. Therefore, the p-type GaAs layer 15 is inevitably deteriorated in crystal quality if it is formed directly on the n-type GaAs region 11. To form the p-type GaAs layer 15 of good crystal quality, an n-type GaAs buffer layer may be interposed between the n-type GaAs region 11 and the p-type GaAs layer 15. This n-type GaAs buffer layer may be grown on the n-type GaAs region 11 through an epitaxial growth step so that it has a good crystal quality surface.

Recently, an MOCVD method has been mainly used as an epitaxial growth method in the fabrication of a GaAs solar cell. The MOCVD method has an advantage that the n-type GaAs buffer layer and the p-type GaAs layer 15 of good crystal quality can be successively formed on the n-type GaAs region 11 through the same crystal growth step. Therefore, if the n-type GaAs buffer layer and the p-type GaAs layer 15 are formed through the same crystal growth step by using the MOCVD method in the formation of the p-type GaAs layer 15, a p-type GaAs layer 15 of superior crystal quality can be formed on the n-type GaAs region 11 of inferior crystal quality without adding another fabrication step. An LPE method or an MBE method may be used in place of the MOCVD method, to form the p-type GaAs layer 15 of good crystal quality through one crystal growth step.

Although a GaAs solar cell is employed in aforementioned embodiments, the present invention can also be applied to Si solar cells and other type solar cells. The cathode electrode 33 is formed so as to short-circuit the n-type GaAs region 11 and the p-type GaAs layer 12 in the embodiment. However, it would be understood by those skilled in the art that electrodes for the n-type GaAs region 11 and the p-type GaAs region 12 may be independently formed and connected with each other through a connector provided in an assembly process, so that an effect similar to that of the disclosed embodiment is obtained.

Although the p-type GaAs layer 15 is grown on the entire light receiving surface and then selectively removed to leave the desired portions thereof in the aforementioned embodiment, the p-type GaAs layer 15 may be selectively grown on the desired portion of the light receiving surface. Further, although two anode electrodes 31 and 32 are provided on the light receiving surface and the back surface, only one of them may be provided in accordance with ease of module assembly.

As hereinabove described, a solar cell according to the present invention is so structured that a first conductivity type first semiconductor layer (n-type GaAs substrate 10) is divided into a first semiconductor region (n-type GaAs region 11) and a second semiconductor region (n-type GaAs region 13) by forming a second conductivity type second semiconductor layer (p-type GaAs layer 12) therebetween, and a second conductivity type third semiconductor layer (p-type GaAs layer 15) is provided on the first semiconductor layer while being separated from the second semiconductor layer and the second semiconductor region. Therefore, the solar cell can have a reverse current flow path through the junction between the second semiconductor layer and the second semiconductor region.

As a result, the solar cell is prevented from breaking down due to a reverse voltage applied thereto. Furthermore, since the number of components required for assembling a solar cell module is not increased, contrary to the conventional solar device in which a diode is externally provided in anti-parallel to the solar cell, the cost for fabricating the solar cell can be decreased and the reliability of the solar cell module can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar cell comprising:
    a first conductivity type first semiconductor layer having first and second major surfaces;
    a second conductivity type second semiconductor layer extending from said first major surface to said second major surface of said first semiconductor layer through said first semiconductor layer, whereby said first semiconductor layer is divided into a first semiconductor region having relatively large size and a second semiconductor region having relatively small size; and
    a second conductivity type third semiconductor layer formed on said first semiconductor region, said third semiconductor layer being separated from said second semiconductor layer and said second semiconductor region.

2. A solar cell in accordance with claim 1, wherein said solar cell further comprises:
    first connection means for electrically connecting said third semiconductor layer with said second semiconductor region; and
    second connection means for electrically connecting said first semiconductor region with said second semiconductor layer.

3. A solar cell in accordance with claim 2, wherein said first connection means includes an insulation film formed on said first semiconductor layer and said second semiconductor layer, and a first external connection electrode formed on said third semiconductor layer, said insulation layer and said second semiconductor region, and
    said second connection means includes a second external connection electrode formed on said first semiconductor region and said second semiconductor layer.

4. A solar cell in accordince with claim 3, wherein said first external connection electrode includes an electrode covering a p-n junction defined by said second semiconductor region and said second semiconductor layer.

5. A solar cell in accordance with claim 3, wherein said first semiconductor layer, said second semiconductor layer and said third semiconductor layer are substantially made of GaAs having dopant impurities.

6. A solar cell in accordance with claim 3, wherein a p-n junction defined by said second semiconductor region and said second semiconductor layer is located at a distance of greater than approximately 20 $\mu$m from an edge of said first semiconductor layer.

7. A solar cell in accordance with claim 3, wherein said first conductivity type is n-type, and said second conductivity type is p-type.

8. A solar cell in accordance with claim 7, wherein said p-type is obtained by introducing Zn atoms into GaAs crystal as dopant impurities.

9. A solar cell in accordance with claim 3, wherein said insulation film includes a silicon nitride ($Si_3N_4$) film.

10. A fabrication method for fabricating a solar cell, comprising the steps of:

(a) preparing a first conductivity type first semiconductor layer having first and second major surfaces:

(b) selectively diffusing dopant impurities into said first semiconductor layer to form a second semiconductor layer of second conductivity type extending from said first major surface of said first semiconductor layer to said second major surface of said first semiconductor layer through said first semiconductor layer, said second semiconductor layer dividing said first semiconductor layer into a first semiconductor region having relatively large size and a second semiconductor region having relatively small size; and (c) forming a second conductivity type third semiconductor layer on said first semiconductor region, said third semiconductor layer being separated from said second semiconductor layer and said second semiconductor region.

11. A fabrication method in accordance with claim 10, wherein said method further comprises the steps of:

(d) electrically connecting said third semiconductor layer with said second semiconductor region; and (e) electrically connecting said first semiconductor region with said second semiconductor layer.

12. A fabrication method in accordance with claim 11, wherein said step (d) includes steps of forming an insulation film on said first semiconductor layer and said second semiconductor layer, and forming a first external connection electrode on said third semiconductor layer, said insulation film and said second semiconductor region, and said step (e) includes a step of forming a second external connection electrode on said first semiconductor region and said second semiconductor layer.

13. A fabrication method in accordance with claim 12, wherein said first external connection electrode is formed to cover a p-n junction defined by said second semiconductor region and said second semiconductor layer.

14. A fabrication method in accordance with claim 12, wherein said first semiconductor layer, said second semiconductor layer and said third semiconductor layer are substantially made of GaAs having dopant impurities.

15. A fabrication method in accordance with claim 12, wherein said second semiconductor layer is so formed that a p-n junction defined by said second semiconductor region and said second semiconductor layer is located at a distance of more than approximately 20 $\mu$m from an edge of said first semiconductor layer.

16. A fabrication method in accordance with claim 12, wherein said first conductivity type is n type, and said second conductivity type is p-type.

17. A fabrication method in accordance with claim 16, wherein said p-type is obtained by introducing Zn atoms into GaAs crystal as dopant impurities.

* * * * *